United States Patent
Taravade et al.

(10) Patent No.: US 7,148,146 B1
(45) Date of Patent: Dec. 12, 2006

(54) METHOD OF FABRICATING AN INTEGRAL CAPACITOR AND GATE TRANSISTOR HAVING NITRIDE AND OXIDE POLISH STOP LAYERS USING CHEMICAL MECHANICAL POLISHING ELIMINATION

(75) Inventors: Kunal N. Taravade, Portland, OR (US); Gregory A. Johnson, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 324 days.

(21) Appl. No.: 10/733,034

(22) Filed: Dec. 11, 2003

Related U.S. Application Data

(62) Division of application No. 10/185,537, filed on Jul. 1, 2002, now Pat. No. 6,699,766.

(51) Int. Cl.
*H01L 21/302* (2006.01)

(52) U.S. Cl. .................. 438/692; 438/250; 438/253; 438/381; 438/396

(58) Field of Classification Search ............... 438/692
See application file for complete search history.

(56) References Cited

U.S. PATENT DOCUMENTS 6,699,766 B1 * 3/2004 Taravade et al. ........... 438/381

* cited by examiner

*Primary Examiner*—Nadine G. Norton
*Assistant Examiner*—Patricia George
(74) *Attorney, Agent, or Firm*—Maginot, Moore & Beck LLP

(57) ABSTRACT

A system, apparatus and/or method is provided for fabricating an integrated capacitor during the fabrication of a transistor employing chemical mechanical polishing of a gate electrode of the transistor. Components of the integrated capacitor, particularly the lower electrode of a parallel plate capacitor in one form thereof, and an outer plate of a cylindrical-like capacitor in another form thereof, are defined by the polish stop layer during chemical mechanical polishing (CMP) of a gate of the transistor. According to an aspect of the subject invention, the polish stop layer may be an oxide or a nitride.

5 Claims, 7 Drawing Sheets

POLISHING APPARATUS

METHOD OF FABRICATING AN INTEGRAL CAPACITOR AND GATE TRANSISTOR HAVING NITRIDE AND OXIDE POLISH STOP LAYERS USING CHEMICAL MECHANICAL POLISHING ELIMINATION

CROSS REFERENCE TO RELATED APPLICATIONS

This is a divisional of U.S. patent application Ser. No. 10/185,537, now U.S. Pat. No. 6,699,766, filed Jul. 1, 2002.

BACKGROUND OF THE INVENTION

1. Field of the Invention

The subject invention relates generally to the field of semiconductor device fabrication and, more specifically, to the fabrication of an integral capacitor structure in a semiconductor device.

2. Description of the Art

The fabrication of a semiconductor wafer to create a semiconductor integrated circuit device typically involves a sequence of processing steps that fabricate the multi-layer structure of integrated circuits comprising integrated circuit components generally associated with the integrated circuit device. Such processing steps may include (1) the deposition of metals, dielectrics, and semiconductor films on the semiconductor wafer, (2) the creation of masks by lithography techniques, (3) the doping of semiconductor layers by diffusion or implantation, (4) the polishing of various layers (e.g. chemical-mechanical polishing), and (5) the etching of various layers for selective or blanket material removal.

Semiconductor integrated circuits are typically fabricated by a layering process in which several layers of material are applied on or in a surface of a wafer, or on or in a surface of a previous layer. These layers can constitute a metal pattern forming various elements of an electrical circuit. Insulating material and dielectric material are added at various stages of the fabrication process. The layers are typically treated to create a smooth, planar surface.

In forming a semiconductor device, one common practice has been to use deposition techniques to apply a particular layer to an existing substrate or layer. In one type of process, such as vapor deposition, reactant gas(s) in a carrier gas, are provided through a tube wherein the gas(s) reacts with the wafer. In a typical vapor deposition process, the thickness of the thin film layer is measured following completion of the deposition. Under these circumstances, the film thickness is generally controlled by the amount of time that the device is exposed to the vapor deposition process. The subsequent measurement of the film thickness is often accomplished in a "go/no-go" manner in which devices having a film thickness falling outside a predetermined thickness range are rejected and scrapped. In other cases, the semiconductor device is returned for further processing, either for additional material deposition, or for material removal such as in a polishing process. Ordinarily, the economics of mass production mitigate in favor of simply scrapping the component.

During the fabrication process, a portion or portions of a layer may be removed. This may be accomplished by chemical mechanical polishing (CMP). CMP is used to selectively remove a portion or portions of a layer of the semiconductor device and/or remove a portion or portions of substrate of the semiconductor device. Typically, a CMP planarization of a wafer involves holding the wafer against a rotating polishing pad that is subjected to a slurry such as a silica-based alkaline slurry. The polishing pad also applies pressure against the wafer.

While it is desirable to use CMP planarization during the fabrication of semiconductor devices, the CMP planarization step may present some problems and drawbacks. For example, each additional CMP step leads to additional costs and additional processing time in the semiconductor fabrication process.

Additionally, a CMP step on a newly formed layer on the wafer may cause alignment targets thereon to lose their steps after the CMP method is performed. The CMP planarization step may also lead to "over polishing" (i.e. removal of material that was not intended to be removed). All of the above results may contribute to defective devices, loss of device yield, and lack of device reliability.

In view of the above, it is desirable to form constituent parts and/or components of a semi-conductor device with as little additional steps as possible. Such constituent parts and/or components include transistors, capacitors, and the like.

What is therefore needed in view of the above, is a system, method and/or apparatus for fabricating multiple components of a semi-conductor device during a common step of the fabrication process.

What is therefore further needed in view of the above is a system, method and/or apparatus for fabricating a capacitor of a semi-conductor device at the same time as fabrication of at least a portion of a transistor of the semi-conductor device.

SUMMARY OF THE INVENTION

The subject invention comprises a system, process and/or apparatus for forming a capacitor during fabrication of a semiconductor device. Particularly, the subject invention comprises a system, process and/or apparatus for forming a capacitor during fabrication of a transistor of a semiconductor device. More particularly, the subject invention comprises a system, process and/or device for forming a capacitor during fabrication of a gate electrode of a transistor of a semiconductor device. Even more particularly, the subject invention comprises a system, process and/or apparatus for forming an integrated capacitor at the same time as fabrication of a gate electrode of a transistor by polishing. Still more particularly, the subject invention comprises a system, process and/or apparatus for forming an integrated capacitor during fabrication of a gate electrode of a transistor employing chemical mechanical polishing (CMP). In one form, capacitor and gate formation utilize an oxide polish stop layer during CMP thereof. In another form, capacitor and gate formation utilize a nitride polish stop layer during CMP thereof.

In one form thereof, the subject invention provides a method of fabricating a capacitor on a substrate. The method includes the steps of: (a) etching at the same time a gate electrode region for a transistor and a first capacitor electrode region on a capacitor foundation formation on the substrate; (b) depositing a first conductive material in the etched gate electrode region and in the etched first capacitor electrode region; (c) performing chemical mechanical polishing of the conductive material to yield a gate electrode and a first capacitor electrode; (d) depositing a dielectric layer over the gate electrode and the first capacitor electrode; (e) etching a second capacitor electrode region in the dielectric layer; (f) depositing a capacitor dielectric material and second conductive material in the etched second capacitor electrode region; and (g) performing chemical mechanical polishing of the second conductive material to yield a second capacitor electrode, the first and second capacitor electrodes and the capacitor dielectric layer forming a capacitor.

In a further form of the above method, the capacitor foundation formation includes an oxide layer, and the step of performing chemical mechanical polishing of the conductive material to yield a gate electrode and a first capacitor electrode utilizes the oxide layer as a polish stop.

In another further form of the above method, the capacitor foundation formation includes a nitride layer, and the step of performing chemical mechanical polishing of the conductive material to yield a gate electrode and a first capacitor electrode utilizes the nitride layer as a polish stop.

In another form thereof, the subject invention provides a method of fabricating a capacitor on a substrate. The method includes the steps of: (a) performing capacitor foundation formation on the substrate; (b) depositing polish stop layer material on the capacitor foundation and the substrate; (c) etching a first capacitor electrode region on the capacitor foundation formation and a transistor gate region on the substrate; (d) depositing a first conductive material in the etched first capacitor electrode region and the transistor gate region; (e) performing chemical mechanical polishing on the deposited first conductive material to yield a gate electrode and a first capacitor electrode; (f) depositing a dielectric material over the gate electrode and the first capacitor electrode; (g) etching a second capacitor electrode region in the dielectric material over the first capacitor electrode and into the first capacitor electrode material; (h) depositing a capacitor dielectric material and second conductive material in the etched second capacitor electrode region; and (i) performing chemical mechanical polishing on the deposited second conductive material to yield a second capacitor electrode.

Without being limiting, the subject invention particularly employs an additional or extra photolithography masking layer for the formation or fabrication of the capacitor. This allows for cost effective manufacturing. Additionally, with a cylindrical capacitor fabricated utilizing the principles of the subject invention, the capacitance per unit area may be designed to be much larger than that of a parallel plate capacitor. This allows for more efficient use of the silicon substrate. Further, the resultant structures of capacitors fabricated in accordance with the principles of the subject invention, are planar with the top surface of the gate electrode of the transistor. This allows for a planar process topology and greater process margins.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views.

DETAILED DESCRIPTION OF THE INVENTION

Figure 1:
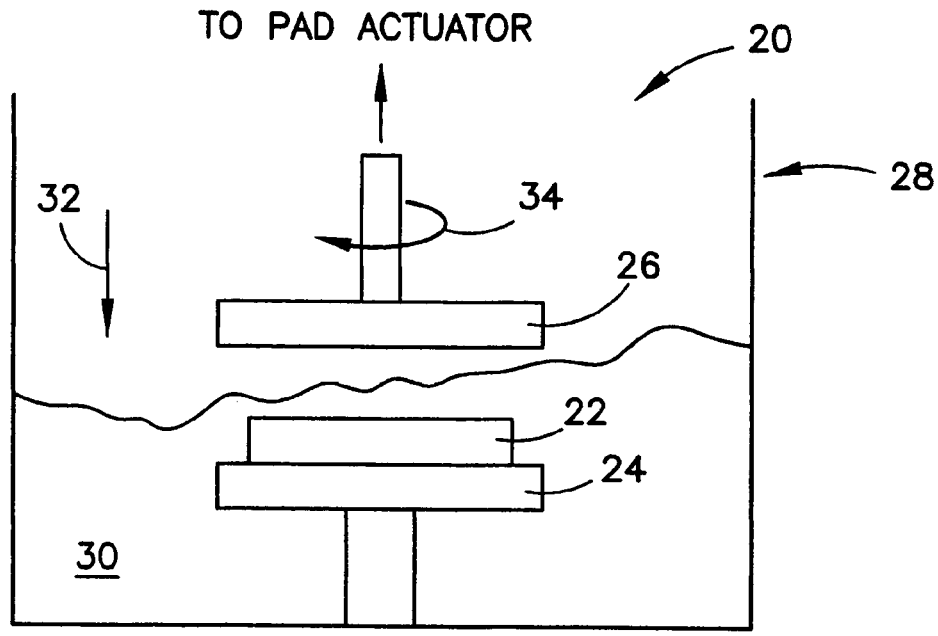
FIG. 1 is a side view of a chemical mechanical polishing (CMP) system for planarizing the surface of a semiconductor device per the principles of the subject invention.

With reference now to FIG. 1, there is shown an exemplary polishing apparatus 20 for performing chemical mechanical polishing (CMP) of a wafer 22. The polishing apparatus 20 includes a table 24 for supporting the wafer 22, a pad 26, and a CMP container 28. The table 24 and the pad 26 are located within the container 28. The wafer 22 is placed on the table 24 and cooled to a temperature ranging from about 70° C. to about 80° C., and preferably about 75° C. A slurry 30 is introduced in the CMP container 28 at a flow rate ranging from about 3 ml/min to about 300 ml/min depending on the sequence of the polishing operation. A normal range of polishing time is between 2 and 3 minutes per wafer.

The pad 26 (which is driven by a CMP motor, not shown) is forced into contact with the wafer 22 in the direction of arrow 32, and is rotated as depicted by arrow 34 so that the various surfaces as described below of the wafer 22 is appropriately polished. The polishing parameters and the polishing consuming items determine the final process characteristics. Table 1 below, provides exemplary polishing parameters and consumables that permit the desired process characteristics. The table 24 may be rotated by a table motor (not shown) either in addition to rotation of the pad 26 or in place of rotation of the pad 26.

TABLE I

| | |
|---|---|
| platen (pad) pressure: | about 10 psi to about 25 psi |
| platen rotation speed: | about 20 rpm to about 75 rpm |
| table rotation speed: | about 10 rpm to about 30 rpm |
| platen temperature: | about 20° C. to about 30° C. |
| slurry composition: | Ammonium Hydroxide ($NH_4OH$) carrier in a proprietary composition |

After performing a CMP step, the protective or buffer layer may be removed using either a wet chemical etch or a dry plasma chemical etch. For example, if the protective or buffer layer is nitride, then a plasma comprising nitrogen trifluoride ($NF_3$) may be used as an etchant. If the protective or buffer layer is oxide, then removal thereof may be performed by, for example, anistropic etching using $CHF_3$/$CF_4$. It should also be appreciated that the deposition of a particular layer (e.g. oxide, polysilicon, and the like) on the wafer 22, is typically performed in a deposition chamber that is not shown. For further data on deposition layers, etching, photolithography, and other semiconductor fabrication procedures, and the like with respect to the subject invention as described herein, reference is made to U.S. Pat. No. 6,277,707 issued to Lee et al. on Aug. 21, 2001 entitled "Method of Manufacturing Semiconductor Device Having A Recessed Gate Structure," the specification of which is specifically incorporated herein by reference in its entirety.

Reference may be made to U.S. Pat. No. 6,277,707 for exemplary types of materials, processes, equipment, and/or dimensions of layers, formations and/or the like with respect to the subject invention. For example, in the formation of a dielectric liner that is formed overlying the surface of a trench region such as is described herein in connection with the subject invention, reference may be made to FIG. 4 of U.S. Pat. No. 6,277,707 and the accompanying text wherein such formation is shown and described.

Figure 2:
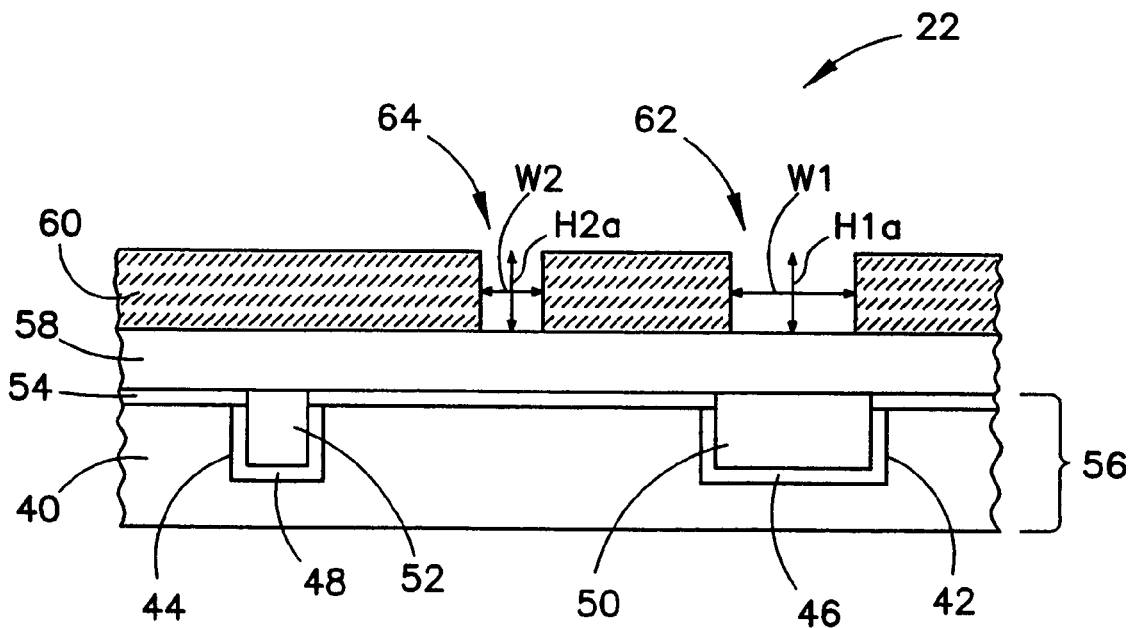
FIG. 2 is a partial side view of a wafer in cross section (including substrate) having undergone in one form, shallow trench isolation (STI) formation, insulation (oxide) layer deposition with optional CMP, and photolithography in accordance with the principles of the subject invention providing a capacitor plate foundation.

Referring now to FIG. 2, there is depicted a cross section of a portion of the wafer 22 that includes a semiconductor substrate 40. Upon completion of the fabrication process, the wafer 22 will ultimately contain many integrated circuit chips, each chip with a plurality of integrated circuit devices and/or components. It should be appreciated that the wafer 22 shown in FIG. 2 has undergone preliminary, initial or previous processing. Such previous processing forms a basis for one form of the invention that is illustrated in two exemplary embodiments of the subject invention. Stated another way, during semiconductor device (transistors, capacitors and the like) fabrication, FIG. 2 shows a stage in which one form of the subject invention may be considered to begin. This form utilizes an oxide polish stop layer in CMP of a gate electrode of a transistor. Particularly, FIG. 2 depicts a stage of semiconductor device fabrication wherein the wafer 22 is ready for transistor gate formation. Additionally, in accordance with the principles of the subject invention, the wafer 22 has undergone capacitor foundation processing. Capacitor foundation processing includes providing (fabricating) an electrically insulating (dielectric) region, area or base for the capacitor and/or a plate or electrode of the capacitor. The wafer 22 in FIG. 2 is showing the current process or process step of photolithography. Dielectric materials may include boron nitride, boron oxynitride, oxynitride, silicon-rich silicon nitride, polysilicon, silicon oxide, and/or other materials or combinations of materials.

In one form, and without being limiting, such capacitor foundation processing may include shallow trench isolation (STI). The substrate 40 of FIG. 2 has undergone shallow trench isolation (STI) formation that is generally designated 56. STI formation 56 starts with depositing a layer 54 of pad oxide and nitride (not shown) on the substrate 40. A photolithography step is then performed that marks the location, area, or region for a capacitor and, according to an aspect of the subject invention, marks the location for the electrically insulating or dielectric region as a foundation for a capacitor or a capacitor plate or electrode. The photolithography step also marks the location of normal device isolation regions (52). The size and/or area of the electrically insulating region (height, width and length) is determined by the design parameters of the capacitor (i.e. by the desired electrical characteristics of the capacitor). This is accomplished via a resist layer (not shown) such as a photoresist or photomask. The resist layer (not shown) is first deposited on the pad oxide and nitride layers and then exposed to light through a photolithographic mask (reticle) that defines a pattern of trench (recess) regions. The resist layer is thus selectively formed on the pad oxide and nitride layers.

The resist layer may be any suitable layer of material(s) capable of protecting any underlying material from being etched during an etching process. Suitable materials for the resist layer include materials having novolac resin and a photoactive dissolution inhibitor. The resist layer may have any suitable thickness. The resist layer is preferably applied by a spin coating method.

Additionally, it should be appreciated that the wafer 22 of FIG. 2 is shown with two regions 42 and 44 for two separate capacitors. Alternatively, the region 44 may be a standard device isolation region (trench region) rather than a capacitor region. This is to illustrate that one or more capacitors (or capacitor plates/electrodes) may be fabricated at the same time, as well as at the same time as the fabrication of one or more transistor gates (i.e. gate electrodes). The subject invention, however, will be described in conjunction with only one of the regions 42.

After photolithography, the marked areas are etched. The etching process is carried out to etch the nitride and pad oxide layers in order to form appropriate trench regions in the substrate 40 that are not covered by the resist layer. Preferably, the sidewalls of the trench region are substantially vertical. A dry anistropic etch, for example, may be used to form the appropriate trench region(s) in the substrate 40. An etchant comprising $CF_4$ gas may be used, with the etch rate ranging from about 3000 Angstroms/minute to about 6000 Angstroms/minute, and preferably from about 4500 Angstroms/minute to about 5000 Angstroms/minute. The flow rate of the above $CF_4$ etchant gas ranges from about 100 standard cubic centimeters per minute (sccm) to about 500 sccm, and preferably from about 200 sccm to about 300 sccm. A preferred ion density for a plasma of the above etchant gas is about $1 \times 10^{10}$ atoms/cm$^3$. Without being limiting, other suitable etchants may also be selected from the following gases or mixtures thereof, such as $CHF_3$, $NF_3$, $SF_6$, Cl/HBr, or a mixture of such gases.

Etching thus yields the regions 42 and 44. After trench etching, the resist from the photolithography is removed or stripped. The resist layer is removed in any suitable manner, for example, by using oxygen plasma ashing and careful wet cleans. In removing the resist layer, a suitable plasma processing apparatus for performing the plasma etch may employ a microwave downstream $O_2/N_2$ plasma with the following parameters: 120 seconds, 250° Celsius (C), 1400 watts, 3000 cc $O_2$, 300 cc $N_2$, and 2.0 Torr.

Thereafter, an oxide growth step may be performed to repair substrate etch damage that may have occurred. An oxide growth layer 46 is present in the region (trench) 42. Likewise, an oxide growth layer 48 is present in the region (trench) 44.

As an example, the dielectric liners 46, 48 are a high-density silicon dioxide material formed by thermal oxidation and is capable of preventing the encroachment into the substrate 40 by a material (e.g. oxide) to be deposited in the trench region(s). For example, a dielectric liner is formed by thermal oxidation under pressure conditions ranging from about $1 \times 10^{-4}$ atmospheres to about $1 \times 10^{-8}$ atmospheres, and preferably ranging from about $1 \times 10^{-5}$ atmospheres to about $1 \times 10^{-7}$ atmospheres. The thermal oxidation takes place at a temperature ranging from about 300° C. to about 700° C., and preferably at about 500° C. and lasts for a duration ranging from about 30 seconds to about 120 seconds, and preferably from about 45 second to about 55 seconds. The dielectric liners 46, 48, can have a thickness ranging from about 700 Angstroms to about 2000 Angstroms and have a preferred thickness of about 1000 Angstroms.

After the oxide growth layer, including trench oxide layers 46 and 48, an insulation or dielectric such as a high density plasma (HDP) oxide is deposited in the oxide layered trenches 42 and 44. The HDP oxide forms blocks 50 and 52 respectively in the trenches 42 and 44. A CMP step is then performed to planarize the HDP oxide using the underlying nitride layer as a polish stop. The nitride layer is then stripped off. After the capacitor foundation (STI) formation 56, an electrically insulating or dielectric layer (e.g. an oxide layer) 58 is deposited thereon. The layer 58 may thereafter undergo an optional subsequent CMP procedure.

Still referring to FIG. 2, once the insulating layer 58 is fabricated, a photolithographic step is performed. The photolithographic step applies a resist layer 60 such as described above, with two or more non-resist regions therein. A non-resist region is situated for each capacitor being fabricated and for each transistor gate being fabricated. With respect to non-resist regions for a capacitor, the particular non-resist region is situated over a corresponding HDP oxide region. With respect to a non-resist region for a transistor gate, the particular non-resist region is situated appropriately (i.e. not over an HDP oxide region for a capacitor).

In the present exemplary case as illustrated in FIG. 2, there are two non-resist regions 62 and 64 formed in the resist layer 60. The non-resist region 62 is situated over the HDP oxide region 50 for fabrication of a capacitor, while the non-resist region 64 is situated over an area of the substrate 40 where there is no HDP oxide region. While not shown, a non-resist region would exist over the HDP oxide region 52 if a capacitor were to be made.

The height H1$a$ of the region 62 corresponds to the height of the resist layer 60. The width W1 of the region 62 corresponds to a width of the eventual capacitor plate being fabricated, while the length (not shown) also corresponds to a length of the eventual capacitor plate being fabricated (as determined by the desired electrical characteristics of the eventual capacitor).

The height H2$a$ of the region 64 corresponds to the height of the resist layer 60. The width W2 of the region 64 corresponds to a width of the eventual gate or gate terminal being fabricated, while the length (not shown) also corresponds to a length of the eventual gate or gate terminal being fabricated.

Figure 3:
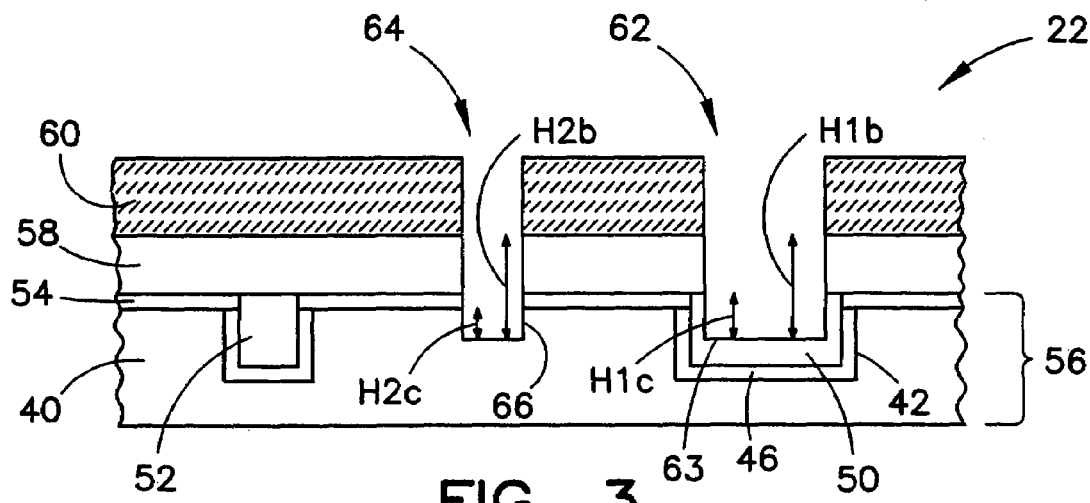
FIG. 3 is the partial side view of the wafer of FIG. 2 having undergone a trench etch step for a transistor gate and a capacitor plate in accordance with the principles of the subject invention.

Referring now to FIG. 3, the wafer is shown after having undergone etching (i.e. a trench etch step) such as described above. Particularly, the region 62 has been trench etched to a height or distance H1$b$ more than the original height or distance H1$a$ such that a region or trench 63 extends into the HDP oxide portion 50 a height or distance H1$c$. The width and length of the trench 63 into the HDP oxide region 50 remains the same. As well, the region 64 has been trench etched to a height or distance H2$b$ more than the original height or distance H2$a$ such that a trench 66 extends into the substrate 40 a height or distance H2$c$. The width and depth of the trench 66 preferably remains the same as the width and depth of the region 64. After trench etching, the resist layer 60 is stripped. After resist strip, a preclean step and sacrificial gate oxide growth step could be performed to repair substrate damage in the trench followed by another preclean step and gate oxide growth step. Polysilicon is then deposited. The oxide growth steps may be replaced with dielectric layer deposition(s).

Figure 4:
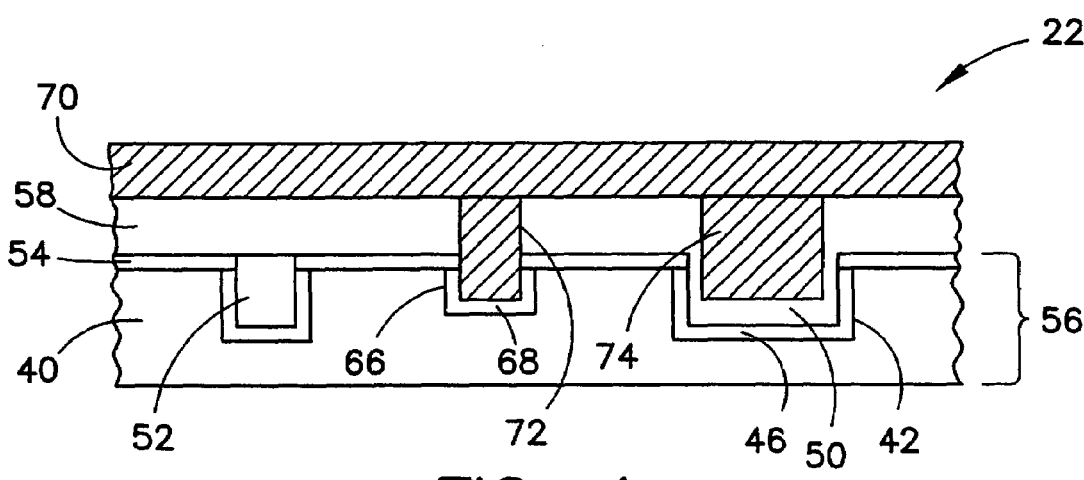
FIG. 4 is the partial side view of the wafer of FIG. 3 having undergone a resist strip, a preclean step, a gate dielectric formation step, and polysilicon deposition.

Referring to FIG. 4, a gate and capacitor electrode (conductive) material is next deposited over the oxide layer 58. The conductive material is formed from any number of metals, metal alloys, semiconductors or doped semiconductors. Examples of suitable gate electrode materials include, but are not limited to, polysilicon, polycides, germanium, aluminum, aluminum with silicon and/or copper, titanium, titanium nitride, copper, tantalum, tantalum nitride, aluminum with refractory metal compounds, alloys of the above, and other metals or metal alloys such as are known in the art. Other suitable conductive materials may also be used to form the gate electrode material. In the present case, the conductive material is preferably polysilicon. The poly layer 70 fills the trenches 62 and 64, such that a conductive block or region 72 is formed in the trench 64 while a conductive block or region 74 is formed in the trench 62.

Figure 5:
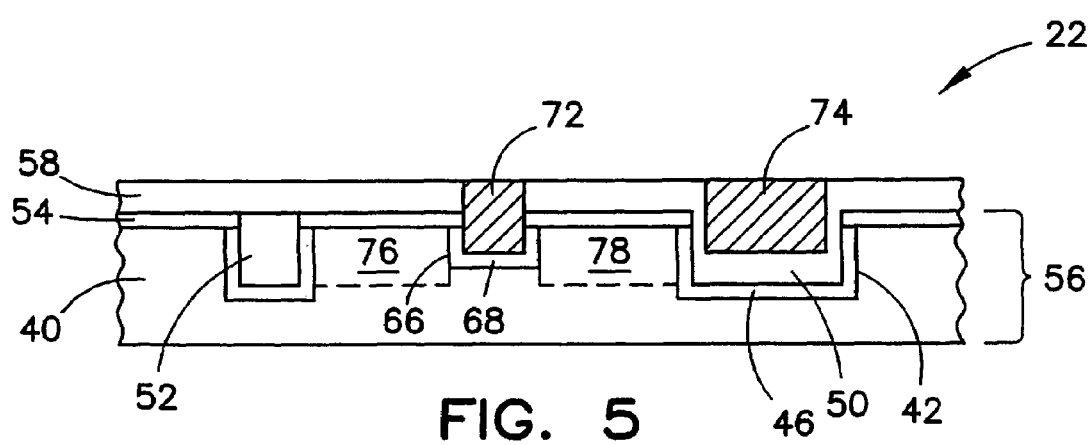
FIG. 5 is the partial side view of the wafer of FIG. 4 having undergone CMP.

Referring to FIG. 5, a CMP step is performed on the poly layer 70 of FIG. 4. Particularly, a CMP step is performed on the poly layer 70 in order to remove the poly layer 70 but leave the conductive regions 72 and 74. The conductive region 72 constitutes a gate or gate electrode/terminal while the conductive region 74 defines one plate or terminal of a capacitor. Additionally, a source/drain implant photolithography step may be performed. The source/drain implant photolithography step would be followed by a source/drain implant and resist strip. After the resist strip, a source 76 and a drain 78 is provided. The source 76 and drain 78 may be interchanged. A source/drain anneal process may be performed sometime during the fabrication process.

Figure 6:
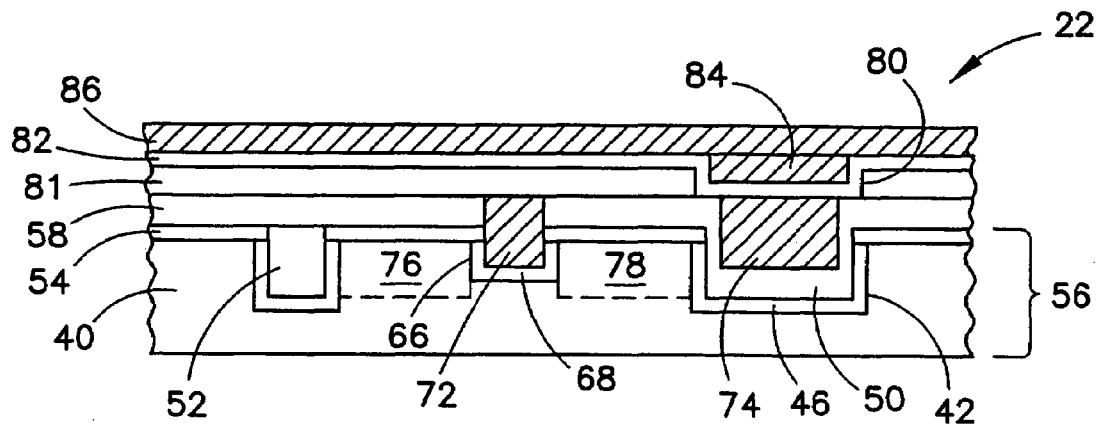
FIG. 6 is the partial side view of the wafer of FIG. 5 having undergone insulator layer deposition, optional subsequent CMP, a photolithography/etch step, optional clean step, capacitor dielectric deposition, and polysilicon deposition.

Referring to FIG. 6, after the CMP of the poly layer 70 as depicted in FIG. 5, an insulator layer 81 is deposited thereon with an optional CMP thereafter. A photolithographic step and an etch step is performed that defines the region 80. The region 80 is the foundation of a plate or electrode of the capacitor. While not shown, the photolithographic step deposits a resist layer that is then stripped off once the region 80 has been etched. A clean step may be performed at this point if desired.

Next, an electrically insulating or dielectric layer 82 is provided. As an example, the insulation layer 82 can be formed from oxide by use of the thermal oxidation method under pressure conditions ranging from about $1 \times 10^{-5}$ atmospheres to about $1 \times 10^{-8}$ atmospheres, preferably from about $1 \times 10^{-6}$ atmospheres to about $1 \times 10^{-7}$ atmospheres. The thermal oxidation takes place at a temperature ranging from about 500° C. to about 900° C., and preferably about 750° C. Alternatively and without being limiting, the insulation layer 82 can be formed from oxide by use of CVD methods or PVD sputtering methods. Other suitable materials may be used to form the insulation layer 82. The dielectric layer 82 extends into the trench or region 80.

Thereafter, a conductive material (e.g. polysilicon) layer 86 is provided that also creates a conductive region 84. At this point, a capacitor annealing step may be performed or the capacitor annealing step may be performed after the insulator deposition, or even later in the process.

Figure 7:
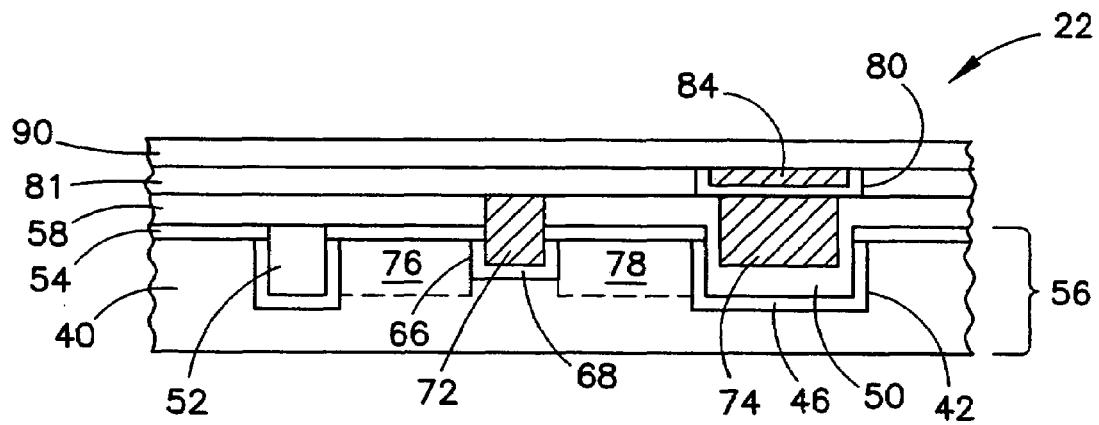
FIG. 7 is the partial side view of the wafer of FIG. 6 having a capacitor and transistor gate fabricated therein, having undergone CMP, insulation layer deposition, and optional CMP.

In FIG. 7, the conductive layer 86 is removed by a CMP step. The CMP step defines the capacitor upper electrode or plate 84 (capacitor lower electrode or plate 74 having been defined previously). Thereafter, an insulator layer 90 (e.g. oxide layer or the like) is provided. In this manner, a capacitor lower plate electrode utilizing an oxide polish stop layer during the gate electrode CMP step is provided. It should be appreciated that the above process utilizing an oxide polish stop layer for fabrication of a capacitor and/or capacitor electrode during the gate electrode CMP step may be utilized to fabricate a capacitor and/or capacitor electrode of any geometry/configuration rather than just a plate-type electrode. Without being limiting, such geometry/configuration may include a cylinder-like capacitor and/or cylinder-like capacitor electrode.

Figure 8:
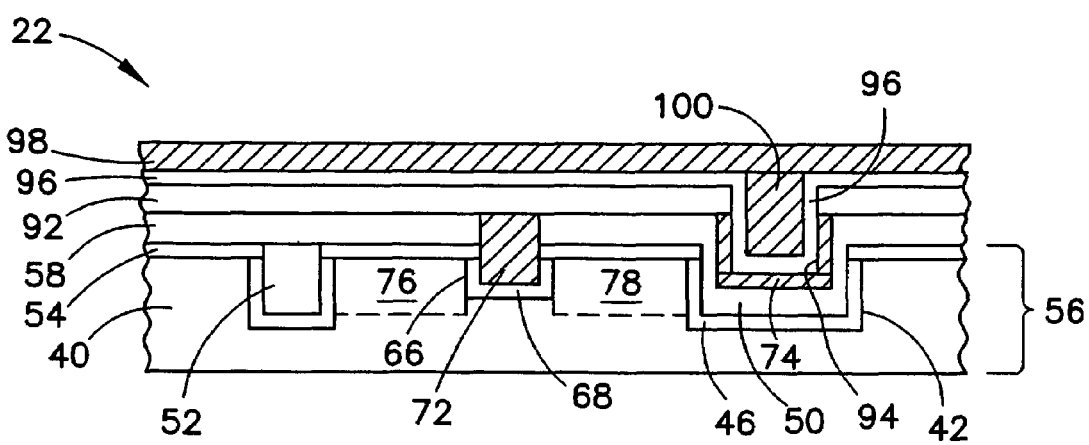
FIG. 8 is the partial side view of the wafer of FIG. 5, having undergone insulator layer deposition, optional subsequent CMP, a photolithography/etch step, optional clean step, capacitor dielectric deposition, and polysilicon deposition.

Referring now to FIG. 8, there is depicted the wafer 22 illustrating a manner of forming a capacitor of another geometry with respect to utilizing an oxide polish stop layer as illustrated in the fabrication of the dual plate capacitor of FIGS. 1–7. The geometry or configuration of the capacitor fabricated utilizing the oxide polish stop process as described below is a cylindrical or cylinder-like capacitor and/or capacitor electrode. Of course, other capacitor and/or capacitor electrode geometries may be fabricated. Thus, while the below capacitor/capacitor electrode fabrication process refers to the capacitor/capacitor electrode as cylindrical, it should be understood that the capacitor/capacitor electrode may be cylindrical, cylinder-like, or any other geometry. It should be appreciated that FIG. 8 preferably begins after FIG. 5 and thus preferably includes the fabrication process/processes illustrated in FIGS. 2–5 and explained herein.

Particularly, for the embodiment resulting in FIG. 8 from FIG. 5, an insulator layer (e.g. oxide) 92 is provided over the layer 58 with an optional subsequent CMP step thereafter. A photolithography step is then performed that applies a resist layer (not shown) to the oxide layer 92 and defines an area for etching the lower capacitor electrode 74. Once this is complete, etching is performed. Particularly, the polysilicon (conductive material) defining the lower capacitor electrode 74 is etched to define a cylindrical or cylindrical-like cavity 94 therein. After an optional clean step, an electrical insulator (dielectric) layer 96 is deposited. The dielectric layer 96 extends into the cavity 94. A polysilicon (conductive) layer 98 is next deposited over the dielectric layer 96. The polysilicon layer 98 fills in the cavity 94 over the dielectric layer 96 to result in a conductive block 100. At this point, a capacitor annealing step may be performed or the capacitor annealing step may be performed after the insulator deposition, or even later in the process.

Figure 9:
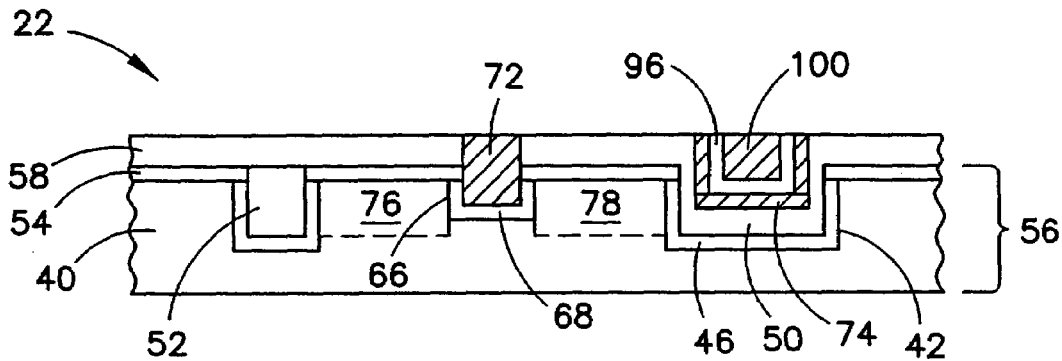
FIG. 9 is the partial side view of the wafer of FIG. 8, having undergone CMP to define an upper capacitor electrode.

Referring to FIG. 9, a CMP process has been performed on the wafer 22 to define the capacitor upper electrode 100. The capacitor upper electrode 100 may be a solid cylinder (or solid cylinder-like electrode) within the cylindrical lower electrode 74. Particularly, the CMP process removes the poly layer 98, the dielectric (e.g. oxide) layer 96, and the layer 92 with layer 58 used as a polish stop. The gate electrode or terminal 72 is flush with the capacitor defined by the electrodes 74 and 100, and the dielectric 96.

Figure 10:
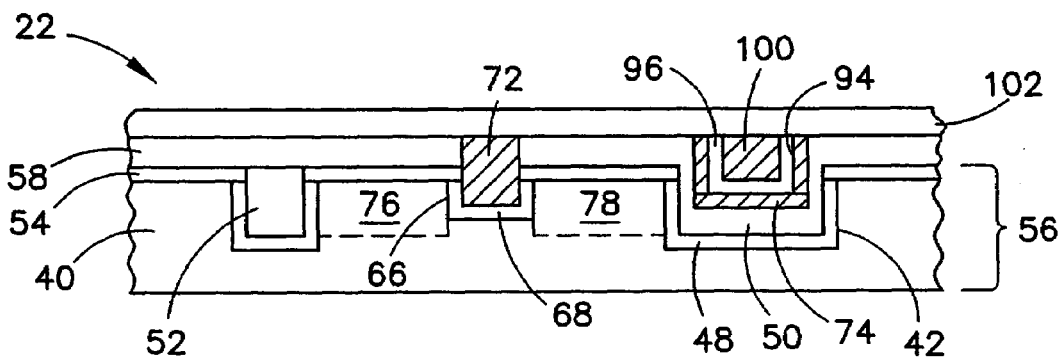
FIG. 10 is the partial side view of the wafer of FIG. 9, having undergone insulator layer deposition, and optional subsequent CMP.

Referring to FIG. 10, an electrical insulator (dielectric) layer 102 of material, preferably an oxide as described herein, is deposited over the capacitor 74, 96, 100 (i.e. the electrodes 74 and 100, and the dielectric 96). In this manner a cylindrical or cylindrical-like capacitor is formed at approximately the same time as a gate electrode for a transistor.

Figure 11:
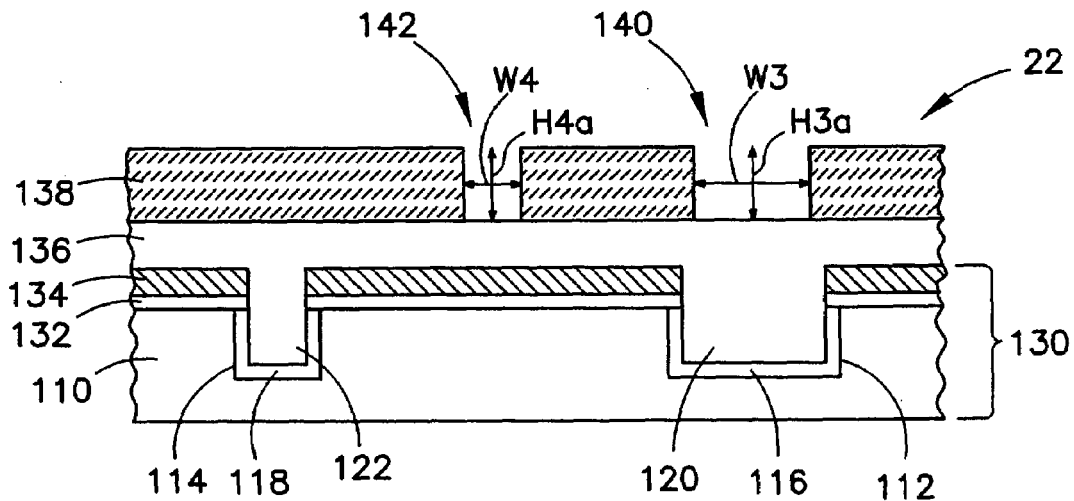
FIG. 11 is a partial side view of a wafer in cross section (including substrate) having undergone in one form, first insulation (pad oxide) layer deposition, second insulation (nitride) layer deposition, STI formation, high density plasma (HDP) insulator deposition with optional CMP, and photolithography in accordance with the principles of the subject invention providing a capacitor plate foundation.

Referring now to FIG. 11, there is depicted a cross section of a portion of the wafer 22 that includes a semiconductor substrate 110. Again, upon completion of the fabrication process, the wafer 22 will ultimately contain many integrated circuit chips, each integrated circuit chip having a plurality of integrated circuit devices and/or components. It should be appreciated that the wafer 22 shown in FIG. 11 has undergone preliminary, initial or previous processing. Such previous processing forms a basis for another form of the invention that is illustrated in two exemplary embodiments. Stated another way, during semiconductor device (transistors, capacitors and the like) fabrication, FIG. 11 shows a stage in which one form of the subject invention may be considered to begin. This form utilizes a nitride polish stop layer in CMP of a gate electrode of a transistor. Particularly, FIG. 11 depicts a stage of semiconductor device fabrication wherein the wafer 22 is ready for transistor gate formation. Additionally, in accordance with the principles of the subject invention, the wafer 22 has undergone capacitor foundation processing. Capacitor foundation processing includes providing (fabricating) an electrically insulating (dielectric) region, area or base for the capacitor and/or a plate or electrode of the capacitor. The wafer 22 in FIG. 11 is showing the current process or process step of photolithography.

In one form, and without being limiting, such capacitor foundation processing may include shallow trench isolation (STI). The substrate 110 of FIG. 11 has undergone shallow trench isolation (STI) formation that is generally designated 130. STI formation 130 starts with depositing a layer 132 of pad oxide and a layer of nitride 134 on the substrate 110. A photolithography step is then performed that marks the location, area, or region for a capacitor and, according to an aspect of the subject invention, marks the location for the electrically insulating or dielectric region as a foundation for a capacitor or a capacitor plate or electrode. The photolithography step also marks the location of normal device isolation regions (122). The size and/or area of the electrically insulating region (height, width and length) is determined by the design parameters of the capacitor (i.e. by the desired electrical characteristics of the capacitor). This is accomplished via a resist layer as described above. Additionally, it should be appreciated that the wafer 22 of FIG. 11 is shown with two regions 112 and 114 for two separate capacitors. Alternatively, the region 114 may be a standard device isolation region (e.g. an isolation trench). This is to illustrate that one or more capacitors (or capacitor plates/electrodes) or devices may be fabricated at the same time, as well as at the same time as the fabrication of one or more transistor gates (i.e. gate electrodes). The subject invention, however, will be described in conjunction with only one of the regions 112.

After photolithography, the marked areas are etched such as described above. Etching thus yields the regions 112 and 114. After trench etching, the resist from the photolithography process is removed or stripped as described above. Thereafter, an oxide growth step may be performed to repair substrate etch damage that may have occurred as described above. An oxide growth layer 116 is present in the region (trench) 112. Likewise, an oxide growth layer 118 is present in the region (trench) 114.

After the oxide growth layer, including trench oxide layers 116 and 118, an insulator or dielectric, such as a high density plasma (HDP) oxide, is deposited in the oxide layered trenches 112 and 114, and on the nitride layer 134. The HDP oxide forms a layer 136 and blocks 120 and 122 respectively in the trenches 112 and 114.

Still referring to FIG. 11, once the layer 136 is fabricated, a photolithographic step is performed. The photolithographic step applies a resist layer 138 with two or more non-resist regions therein. A non-resist region is situated for each capacitor being fabricated and for each transistor gate being fabricated. With respect to non-resist regions for a capacitor, the particular non-resist region is situated over a corresponding HDP oxide region. With respect to a non-resist region for a transistor gate, the particular non-resist region is situated appropriately (i.e. not over an HDP oxide region for a capacitor).

In the present exemplary case as illustrated in FIG. 11, there are two non-resist regions 140 and 142 formed in the resist layer 138. The non-resist region 140 is situated over the HDP oxide region 120 for fabrication of a capacitor, while the non-resist region 144 is situated over an area of the substrate 110 where there is no HDP oxide region. While not shown, a non-resist region would exist over the HDP oxide region 122 if a capacitor were to be made.

The height H3$a$ of the region 140 corresponds to the height of the resist layer 138. The width W3 of the region 140 corresponds to a width of the eventual capacitor plate or electrode being fabricated, while the length (not shown) also corresponds to a length of the eventual capacitor plate or electrode being fabricated (as determined by the desired electrical characteristics of the eventual capacitor).

The height H4$a$ of the region 142 corresponds to the height of the resist layer 138. The width W4 of the region 142 corresponds to a width of the eventual gate or gate terminal being fabricated, while the length (not shown) also corresponds to a length of the eventual gate or gate terminal being fabricated.

Figure 12:
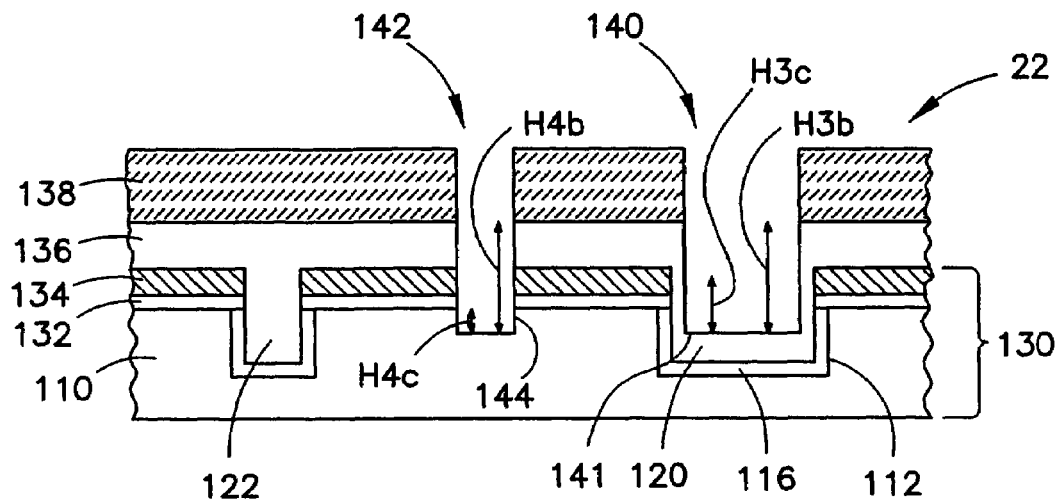
FIG. 12 is the partial side view of the wafer of FIG. 11 having undergone a trench etch step for a transistor gate and a capacitor plate in accordance with the principles of the subject invention.

Referring now to FIG. 12, the wafer is shown after having undergone etching (i.e. a trench etch step) such as described above. Particularly, the region 140 has been trench etched to a height or distance H3$b$ more than the original height or distance H3$a$ such that a region or trench 141 extends into the HDP oxide portion 120 a height or distance H3$c$. The width and length of the trench 141 into the HDP oxide region 120 remains the same. As well, the region 142 has been trench etched to a height or distance H4$b$ more than the original height or distance H4$a$ such that a trench 144 extends into the substrate 110 a height or distance H4$c$. The width and length of the trench 144 preferably remains the same as the width and length of the region 142. After trench etching, the resist layer 138 is stripped. After resist strip, a preclean step and sacrificial gate oxide growth step could be performed to repair substrate damage in the trench followed by another preclean step and gate oxide growth step. Polysilicon is then deposited. The oxide growth steps may be replaced with dielectric layer deposition(s).

Figure 13:
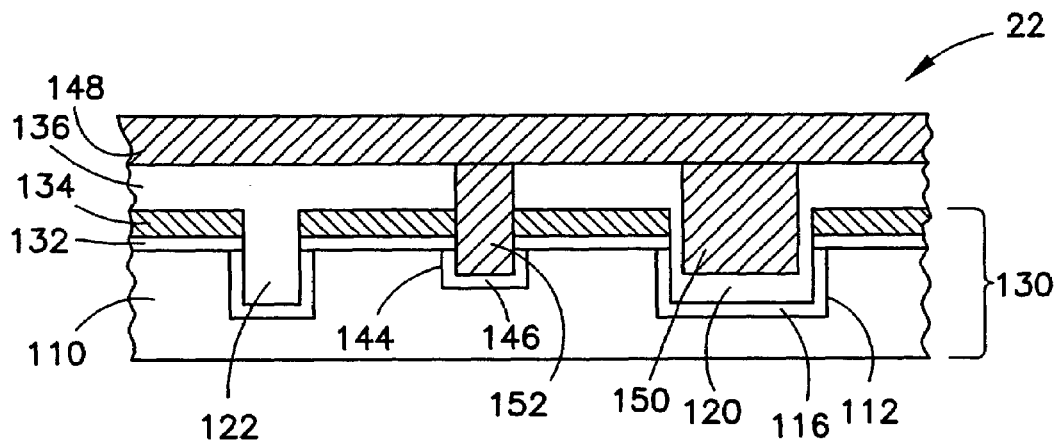
FIG. 13 is the partial side view of the wafer of FIG. 12 having undergone a resist strip, a preclean step, gate dielectric formation, and polysilicon deposition.

Referring to FIG. 13, a gate and capacitor electrode (conductive) material (e.g. a polysilicon or poly) layer 148 is next deposited over the oxide layer 136. The poly layer 148 fills the trenches 140 and 142, such that a conductive (poly) block or region 150 is formed in the trench 140 while a conductive (poly) block or region 152 is formed in the trench 142.

Figure 14:
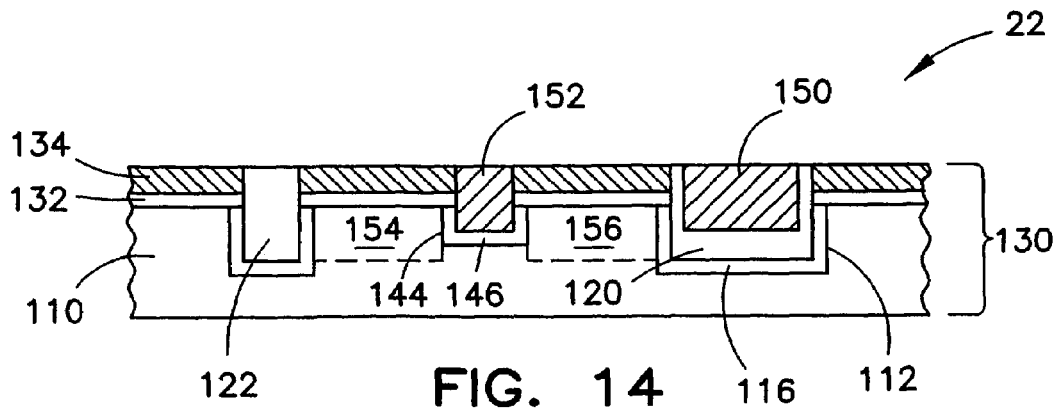
FIG. 14 is the partial side view of the wafer of FIG. 13 having undergone CMP down to the second insulation (nitride) layer.

Referring to FIG. 14, a CMP step is performed on the poly layer 148 and the oxide layer 136 of FIG. 13. Particularly, a CMP step is performed on the poly layer 148 and the oxide layer 136 in order to remove both layers but leave the conductive regions 150 and 152. The conductive region 152 constitutes a gate or gate electrode/terminal while the conductive region 150 defines one plate or terminal of a capacitor. Additionally, a source/drain implant photolithography step may be performed. The source/drain implant photolithography step would be followed by a source/drain implant and resist strip. After the resist strip, a source 154 and a drain 156 is provided. The source 154 and drain 156 may be interchanged. A source/drain anneal process may be performed at some time in the fabrication process.

Figure 15:
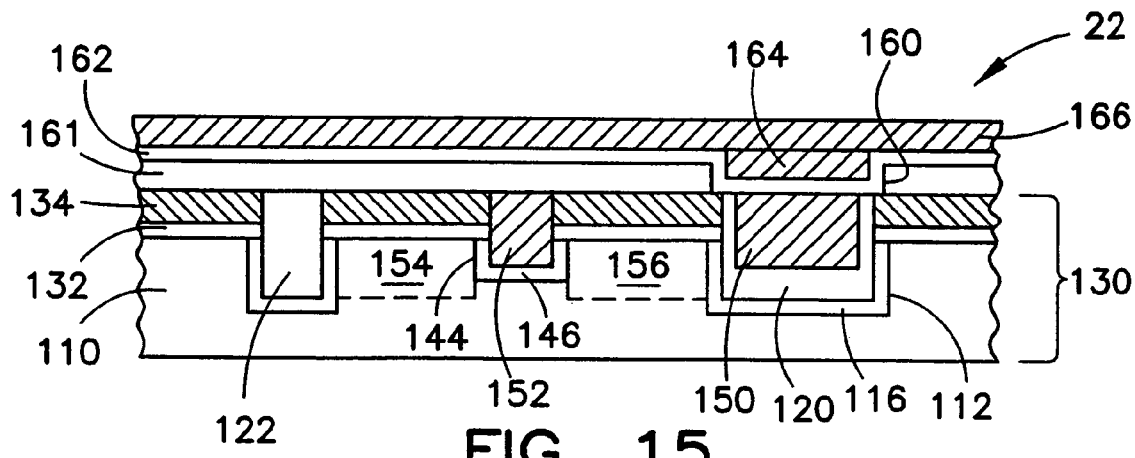
FIG. 15 is the partial side view of the wafer of FIG. 14 having undergone insulator layer deposition, optional subsequent CMP, a photolithography/etch step, optional clean step, capacitor dielectric deposition, and polysilicon deposition.

Referring to FIG. 15, after the CMP of the poly and oxide layers 148 and 136 as depicted in FIG. 14, an insulator layer 161 is deposited thereon with an optional CMP thereafter. A photolithographic step and an etch step is performed thereafter that defines the region 160. The region 160 is the foundation of a plate or electrode of the capacitor. While not shown, the photolithographic step deposits a resist layer that is then stripped off once the region 160 has been etched. A clean step may be performed at this point if desired.

Next, an electrically insulating or dielectric layer 162 is provided as described above. The dielectric layer 162 extends into the trench or region 160. Thereafter, a conductive material (e.g. a polysilicon) layer 166 is provided that also creates a conductive (poly) region 164. At this point, a capacitor annealing step may be performed or the capacitor annealing step may be performed after the insulator deposition, or even later in the process.

Figure 16:
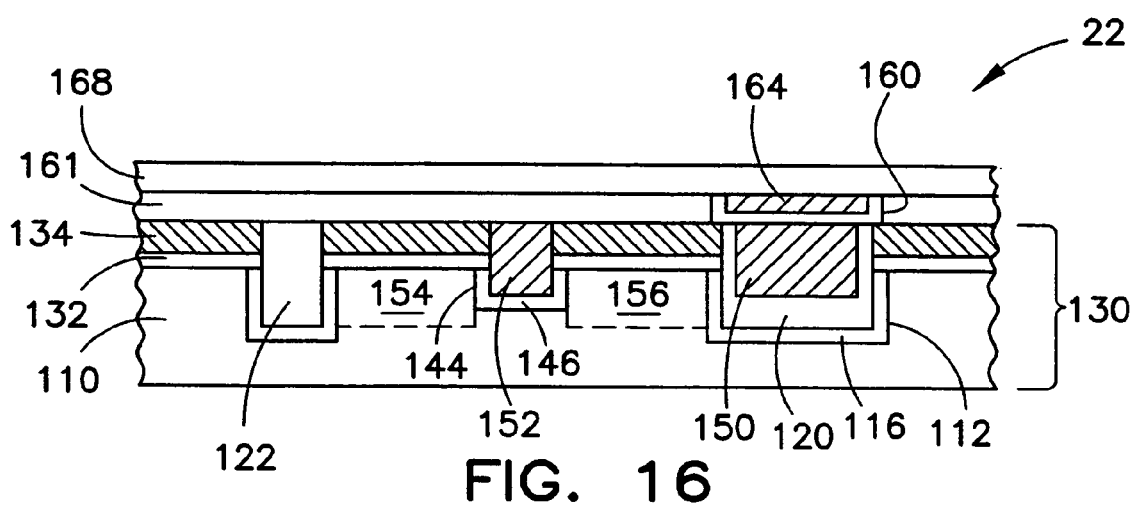
FIG. 16 is the partial side view of the wafer of FIG. 15 having a capacitor and transistor gate fabricated therein, having undergone CMP, insulation layer deposition, and optional subsequent CMP.

In FIG. 16, the conductive (poly) layer 166 and the dielectric (e.g. oxide) layer 162 are removed by a CMP step. The CMP step defines the capacitor upper electrode or plate 164 (capacitor lower electrode or plate 150 having been defined previously). Thereafter, an insulator layer 168 (e.g. oxide layer or the like) is provided. In this manner, a capacitor lower plate electrode utilizing a nitride polish stop layer during the gate electrode CMP step is provided. It should be appreciated that the above process utilizing a nitride polish stop layer for fabrication of a capacitor and/or capacitor electrode during the gate electrode CMP step may be utilized to fabricate a capacitor and/or capacitor electrode of any geometry/configuration rather than just a plate-type electrode. Without being limiting, such geometry/configuration may include a cylinder-like capacitor and/or cylinder-like capacitor electrode.

Figure 17:
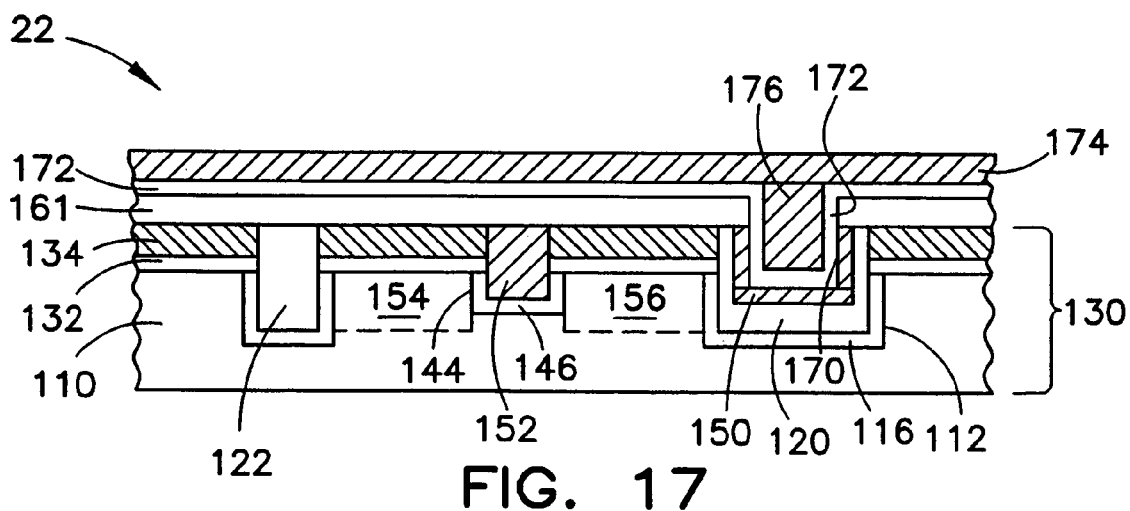
FIG. 17 is the partial side view of the wafer of FIG. 14, having undergone insulator layer deposition, optional subsequent CMP, a photolithography/etch step, optional clean step, capacitor dielectric deposition, and polysilicon deposition.

Referring now to FIG. 17, there is depicted the wafer 110 illustrating another embodiment of the subject invention with respect to utilizing a nitride polish stop layer as illustrated for the fabrication of the dual plate (electrode) capacitor of FIGS. 11–16. The geometry or configuration of the capacitor fabricated utilizing the nitride polish stop process as described below is a cylindrical or cylinder-like capacitor and/or capacitor electrode. Of course, other capacitor and/or capacitor electrode geometries may be fabricated. Thus, while the below capacitor/capacitor electrode fabrication process refers to the capacitor/capacitor electrode as cylindrical, it should be understood that the capacitor/capacitor electrode may be cylindrical, cylinder-like, or any other geometry. It should be appreciated that FIG. 17 begins after FIG. 14 and thus includes the fabrication process/processes illustrated in FIGS. 11–14 and explained herein.

Particularly, for the embodiment resulting in FIG. 17 from FIG. 14, an insulator layer (e.g. oxide) 161 is provided over the layer 134 with an optional subsequent CMP step thereafter. A photolithography step is then performed that applies a resist layer (not shown) to the oxide layer 161 and defines an area for etching the lower capacitor electrode 150. Once this is complete, etching is performed. Particularly, the polysilicon (conductive material) defining the lower capacitor electrode 150 is etched to define a cylindrical or cylindrical-like cavity 170 therein. After an optional clean step, an electrical insulator (dielectric) layer 172 is deposited. The dielectric layer 172 extends into the cavity 170. A polysilicon (conductive material) layer 174 is next deposited over the dielectric layer 172. The polysilicon layer 174 fills in the cavity 170 over the dielectric layer 172 to result in a conductive (poly) block 176. At this point, a capacitor annealing step may be performed or the capacitor annealing step may be performed after the insulator deposition, or even later in the process.

Figure 18:
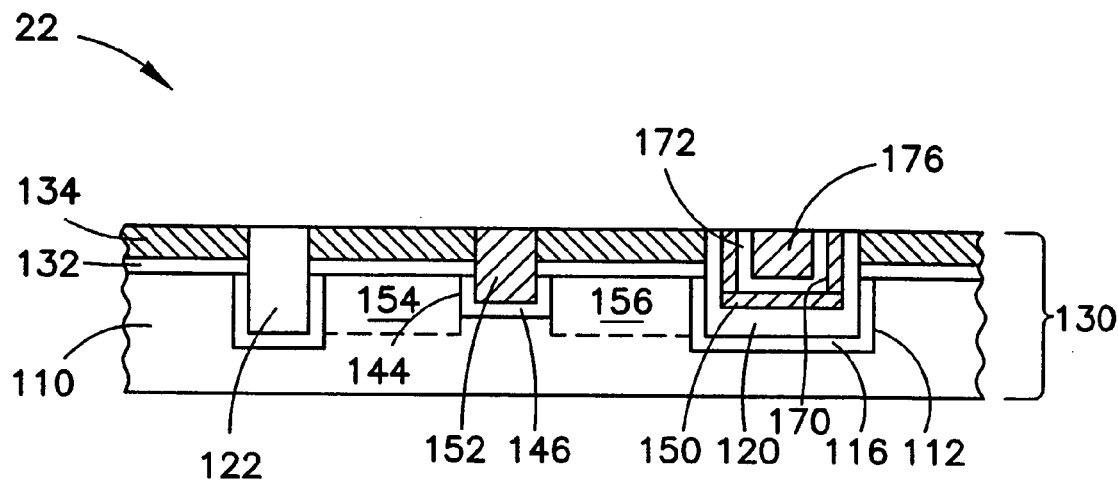
FIG. 18 is the partial side view of the wafer of FIG. 17, having undergone CMP to define an upper capacitor electrode.

Referring to FIG. 18, a CMP process has been performed on the wafer 22 to define the capacitor upper electrode or cylinder 176. Again, the cylinder 176 is preferably a solid cylinder (or solid cylinder-like electrode) within the cylindrical electrode 150. Particularly, the CMP process removes the poly layer 174, the dielectric (e.g. oxide) layer 172, and the layer 161, wherein the nitride layer 134 is used as a polish stop. The gate electrode or terminal 152 is flush with the capacitor defined by the electrodes 176 and 150, and the dielectric 172.

Figure 19:
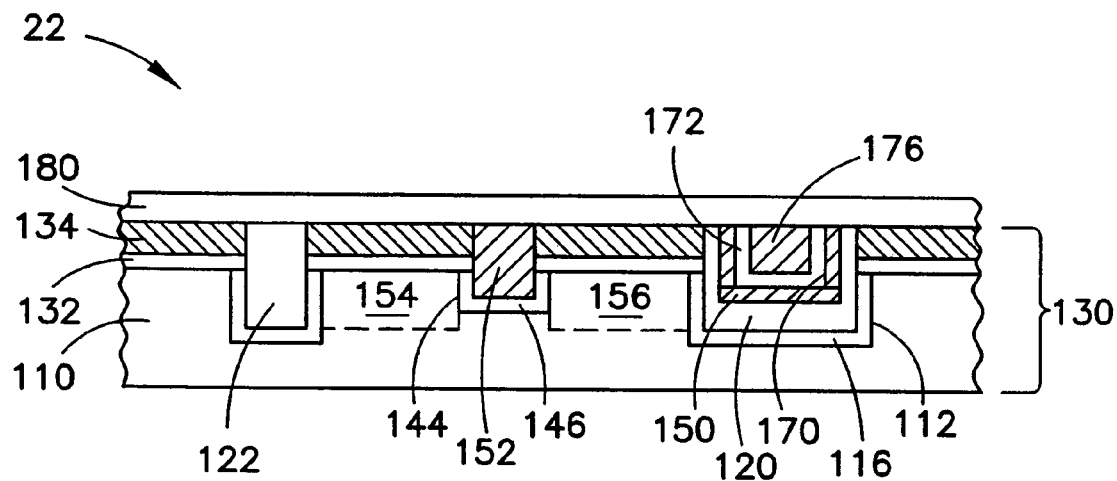
FIG. 19 is the partial side view of the wafer of FIG. 18, having undergone insulator layer deposition and optional subsequent CMP.

Referring to FIG. 19, an electrical insulator (dielectric) layer 180 of material, preferably an oxide, is deposited over the capacitor 176, 150, 172 (i.e. the electrodes 176 and 150, and the dielectric 172). In this manner a cylindrical or cylindrical-like capacitor is formed at approximately the same time as a gate electrode for a transistor.

While this invention has been described as having a preferred design and/or configuration, the subject invention can be further modified within the spirit and scope of this disclosure. This application is therefore intended to cover any variations, uses, or adaptations of the invention using its general principles. Further, this application is intended to cover such departures from the subject disclosure as come within known or customary practice in the art to which this invention pertains and which fall within the limits of the appended claims.

What is claimed is:

1. A method of fabricating a capacitor on a substrate comprising the steps of:
    performing capacitor foundation formation on the substrate;
    depositing polish stop layer material on the capacitor foundation and the substrate;
    etching a first capacitor electrode region on the capacitor foundation formation and a transistor gate region on the substrate;
    depositing a first conductive material in the etched first capacitor electrode region and the transistor gate region;
    performing chemical mechanical polishing on the deposited first conductive material to yield a gate electrode and a first capacitor electrode;
    depositing a dielectric material over the gate electrode and the first capacitor electrode;
    etching a second capacitor electrode region in the dielectric material over the first capacitor electrode and into the first capacitor electrode material;
    forming a capacitor dielectric layer over the first capacitor electrode;
    depositing a second conductive material in the etched second capacitor electrode region; and
    performing chemical mechanical polishing on the deposited second conductive material to yield a second capacitor electrode.

2. The method of claim 1, wherein the step of depositing polish stop layer material on the capacitor foundation substrate includes depositing polish stop layer material comprising an oxide.

3. The method of claim 1, wherein the step of depositing polish stop layer material on the capacitor foundation substrate includes depositing polish stop layer material comprising a nitride.

4. The method of claim 1, wherein the steps of performing chemical mechanical polishing on the deposited first conductive material to yield a first capacitor electrode yields a first electrode in the form of a plate, and performing chemical mechanical polishing on the deposited second conductive material to yield a second capacitor electrode yields a second electrode in the form of a plate.

5. The method of claim 1, wherein the steps of performing chemical mechanical polishing on the deposited first conductive material to yield a first capacitor electrode yields a first substantially cylindrical electrode and performing chemical mechanical polishing on the deposited second conductive material to yield a second capacitor electrode yields a second substantially cylindrical electrode.

* * * * *